US012269353B2

(12) United States Patent
Sakai (10) Patent No.: US 12,269,353 B2
(45) Date of Patent: Apr. 8, 2025

(54) ELECTRONIC DEVICE, BATTERY PACK, AND ELECTRIC VEHICLE (71) Applicant: MURATA MANUFACTURING CO., LTD., Kyoto (JP)

(72) Inventor: Takashi Sakai, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 346 days.

(21) Appl. No.: 17/939,091

(22) Filed: Sep. 7, 2022

(65) Prior Publication Data

US 2023/0045748 A1 Feb. 9, 2023

Related U.S. Application Data (63) Continuation of application No. PCT/JP2021/008753, filed on Mar. 5, 2021.

(30) Foreign Application Priority Data

Mar. 10, 2020 (JP) .................................. 2020-040895

(51) Int. Cl.
*B60L 50/64* (2019.01)
*H05K 5/06* (2006.01)
(52) U.S. Cl.
CPC .............. *B60L 50/64* (2019.02); *H05K 5/061* (2013.01); *H05K 5/069* (2013.01)
(58) Field of Classification Search
CPC ..... H05K 5/069; H05K 5/061; H01M 50/183; H01M 50/184; H01M 50/188; H01M 50/186
See application file for complete search history.

(56) References Cited

U.S. PATENT DOCUMENTS 3,564,113 A * 2/1971 Kindler ............... B60R 16/0222
174/669
5,836,212 A 11/1998 Bates
(Continued)

FOREIGN PATENT DOCUMENTS

CN 103891073 6/2014
DE 102012015919 2/2014
(Continued)

OTHER PUBLICATIONS

Chinese Office Action issued Jul. 25, 2023 in corresponding Chinese Application No. 202180020407.9.
(Continued)

*Primary Examiner* — Emma K Frick
(74) *Attorney, Agent, or Firm* — K&L Gates LLP (57) ABSTRACT An electronic device includes: an exterior case that has a first case and a second case engaged with each other; a first lead wire and a second lead wire extended from the inside of the exterior case; a first grommet through which the first lead wire is penetrated; and a second grommet through which the second lead wire is penetrated, where the first grommet is inserted in a first notch formed in the first case, the second grommet is inserted in a second notch formed at a position that substantially faces the first notch in the second case, and a continuous O-ring is interposed between the first case and the second case and between the first grommet and the second grommet.

6 Claims, 10 Drawing Sheets

(56) References Cited

U.S. PATENT DOCUMENTS

| | | | | |
|---|---|---|---|---|
| 5,907,653 | A * | 5/1999 | Burek | G02B 6/3801 |
| | | | | 385/135 |
| 6,743,981 | B2 * | 6/2004 | Miyakoshi | H02G 3/088 |
| | | | | 174/668 |
| 6,768,054 | B2 * | 7/2004 | Sato | H02G 3/088 |
| | | | | 174/53 |
| 7,186,929 | B2 * | 3/2007 | Cox | H02G 3/088 |
| | | | | 174/152 G |
| 9,764,651 | B2 * | 9/2017 | Moon | B60L 53/16 |
| 10,041,595 | B2 * | 8/2018 | Takao | H02G 3/088 |
| 10,498,121 | B1 * | 12/2019 | Luo | H02G 3/18 |
| 11,051,417 | B2 * | 6/2021 | Cmich | H02G 3/083 |
| 11,202,384 | B2 * | 12/2021 | Peng | H05K 5/069 |
| 12,196,323 | B2 * | 1/2025 | Hsiao | F16J 15/108 |
| 2007/0215614 | A1 | 9/2007 | Matsui | |
| 2013/0026161 | A1 * | 1/2013 | I | H02G 3/088 |
| | | | | 220/3.8 |
| 2014/0041391 | A1 | 2/2014 | DiCintio et al. | |
| 2014/0252722 | A1 | 9/2014 | Takao et al. | |
| 2015/0035418 | A1 * | 2/2015 | Shiu | H05K 5/069 |
| | | | | 312/223.1 |
| 2017/0052585 | A1 | 2/2017 | Pololefsky | |

FOREIGN PATENT DOCUMENTS

| | | |
|---|---|---|
| JP | 2007-269304 | 10/2007 |
| JP | 2007269304 A | 10/2007 |
| WO | 2013051301 A1 | 4/2013 |

OTHER PUBLICATIONS

International Search Report of corresponding PCT application PCT/JP2021/008753, dated May 25, 2021.

* cited by examiner

ELECTRONIC DEVICE, BATTERY PACK, AND ELECTRIC VEHICLE

TECHNICAL FIELD

The present invention relates to an electronic device, a battery pack, and an electric vehicle.

BACKGROUND ART

In recent years, secondary batteries have been expanding in application. For example, lithium ion secondary batteries, which are typical examples of secondary batteries, have been expanding in application not only to various electronic devices but also to automobiles, motorcycles, electric flight vehicles, and the like. The lithium ion secondary battery is used, typically with the battery housed in a case. For preventing heat generation or ignition associated with the lithium ion secondary battery short-circuited, it is necessary to secure the confidentiality of the case, thereby preventing entry of foreign matters such as moisture into the case. Thus, in accordance with the technique described in Patent Document 1 below, the entry of foreign matters into the waterproof cases is prevented by providing a packing between the upper and lower waterproof cases, and fitting, to the lower waterproof case, one grommet into which a wire harness is inserted.

PRIOR ART DOCUMENT

Patent Document

Patent Document 1: Japanese Patent Application Laid-Open No. 2004-72877

SUMMARY OF THE INVENTION

Problem to be Solved by the Invention

The technique described in Patent Literature 1, however, fails to consider a case where multiple wirings are disposed in the waterproof cases, and further fails to consider how to prevent the entry of foreign matters into the waterproof cases when multiple wirings are disposed in the waterproof cases.

Accordingly, an object of the present invention is to provide an electronic device, a battery pack, and an electric vehicle that are adapted to secure the confidentiality of a case in which multiple wirings are disposed.

Means for Solving the Problem

The present invention provides an electronic device including: an exterior case that has a first case and a second case engaged with each other; a first lead wire and a second lead wire extended from the inside of the exterior case; a first grommet through which the first lead wire is penetrated; and a second grommet through which the second lead wire is penetrated, where the first grommet is inserted in a first notch formed in the first case, the second grommet is inserted in a second notch formed at a position that substantially faces the first notch in the second case, and a continuous O-ring is interposed between the first case and the second case and between the first grommet and the second grommet.

In addition, the present invention provides a battery pack including: an exterior case that has a first case and a second case engaged with each other; a battery unit including a plurality of batteries, housed in the exterior case; a first lead wire and a second lead wire extended from the battery unit; a first grommet through which the first lead wire is penetrated; and a second grommet through which the second lead wire is penetrated, where the first grommet is inserted in a first notch formed in the first case, the second grommet is inserted in a second notch formed at a position that substantially faces the first notch in the second case, and a continuous O-ring is interposed between the first case and the second case and between the first grommet and the second grommet.

Advantageous Effect of the Invention

According to at least an embodiment of the present invention, the confidentiality of the case in which multiple wirings are disposed can be secured. It is to be noted that the contents of the present invention are not to be construed as being limited by the effects illustrated in this specification.

MODE FOR CARRYING OUT THE INVENTION

Hereinafter, embodiments and the like of the present invention will be described with reference to the drawings. It is to be noted that the description will be provided in the following order.

EMBODIMENT

Modification Example

Application Example

The embodiment and the like described below are preferred specific examples of the present invention, and the contents of the present invention are not to be considered limited to the embodiments and the like.

It is to be noted that the members recited in the claims are not to be considered specified as members according to the embodiment. In particular, the scope of the present invention is, unless otherwise described, not intended to be limited to only the dimensions, materials, and shapes of the constituent members described in the embodiments, the relative configurations thereof, and the description of directions such as upward, downward, leftward, and rightward directions, which are considered by way of illustrative example only. It is to be noted that sizes, positional relationships, and the like of the members illustrated in the respective drawings may be exaggerated for the clarity of description, and for preventing complicated illustrations, only some of reference numerals may be illustrated, or the illustration may be simplified in consideration of convenience of description. Furthermore, in the following description, the same names and reference numerals represent the identical or same members, and redundant descriptions thereof will be appropriately omitted. Furthermore, for each element constituting the present invention, an aspect may be employed such that one member also serves as multiple elements made of the same member, or conversely, the function of one member can be shared and achieved by a plurality of members.

Embodiment

Figure 1:
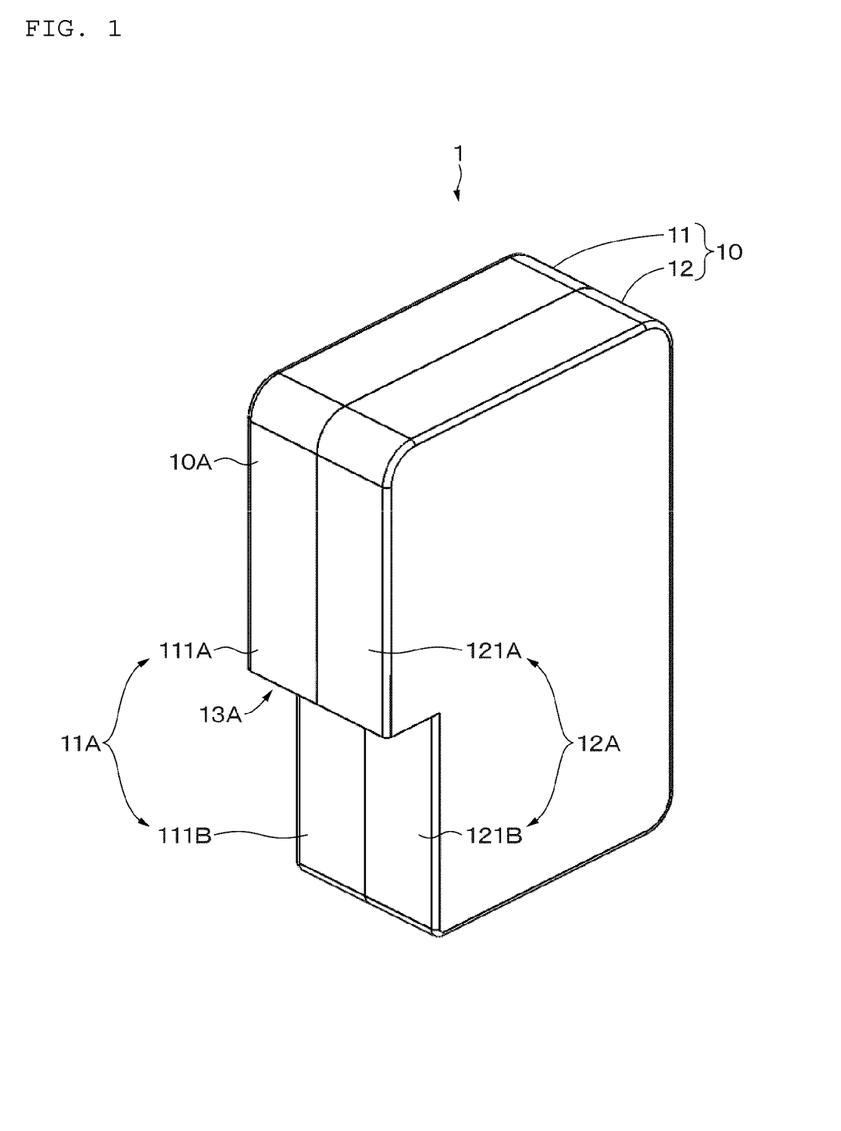
FIG. 1 is an external view of a battery pack according to an embodiment.
Figure 2:
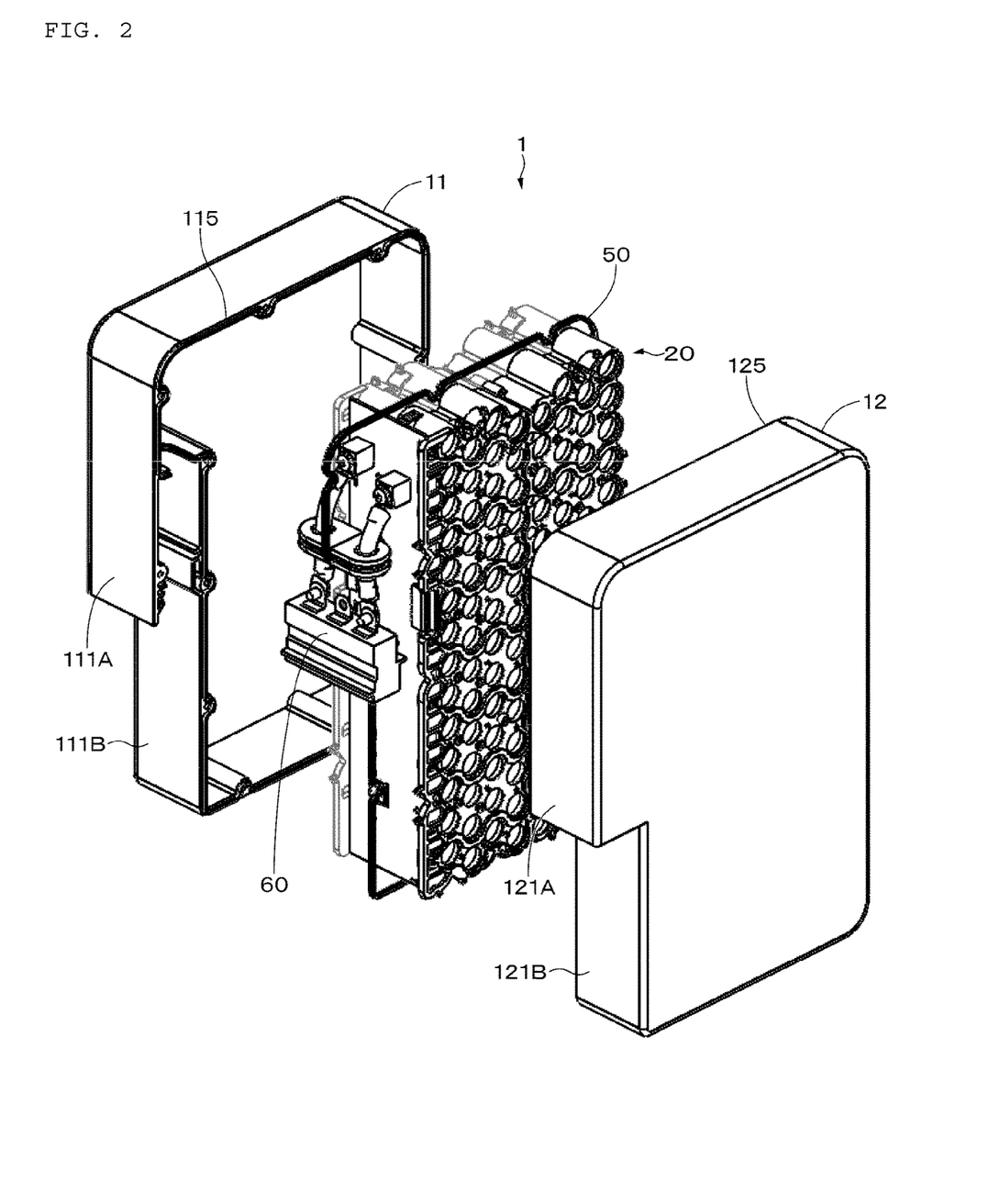
FIG. 2 is an exploded perspective view of the battery pack according to the embodiment.
Figure 3:
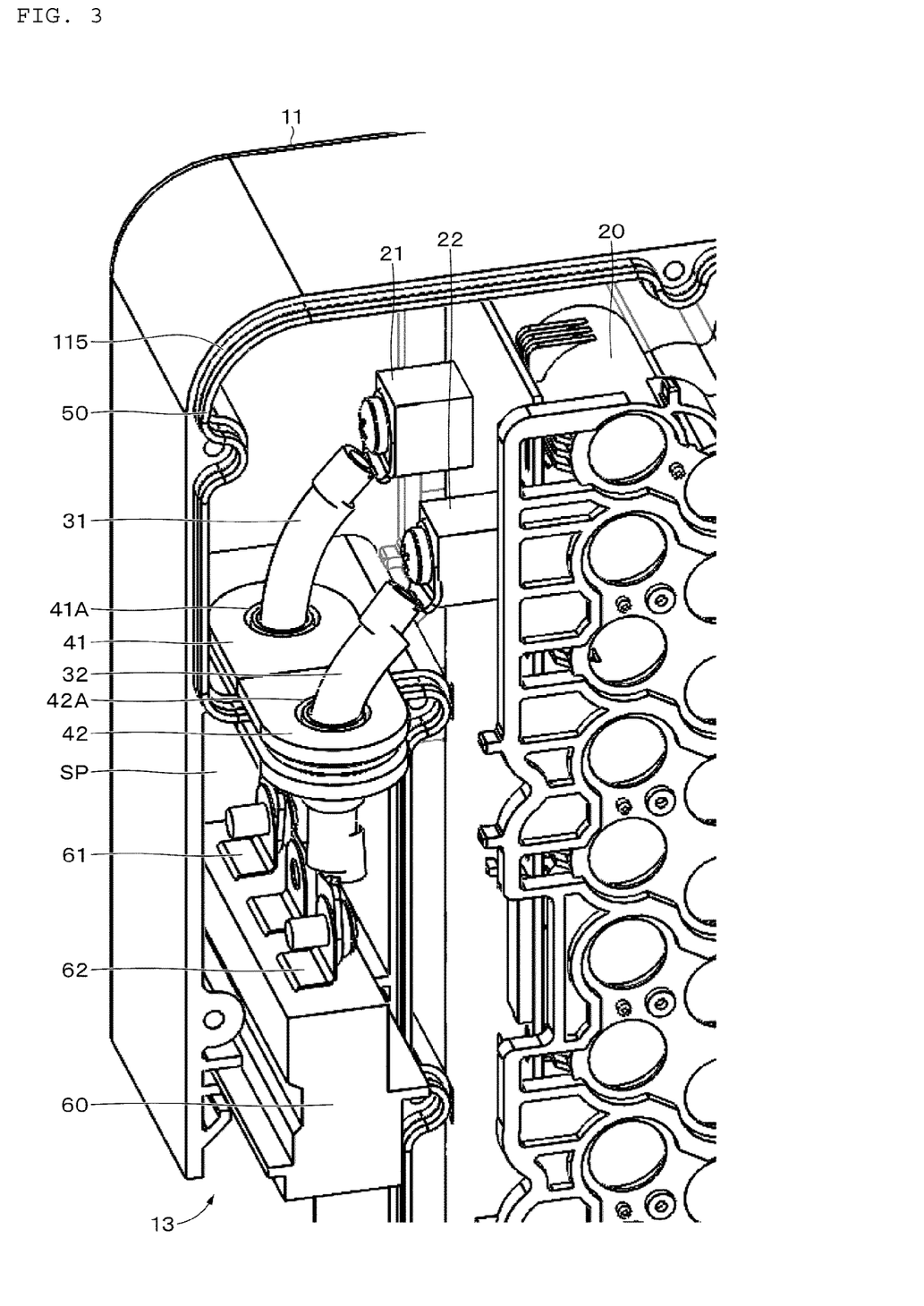
FIG. 3 is an enlarged view of a part of an internal configuration of the battery pack according to the embodiment.
Figure 4:
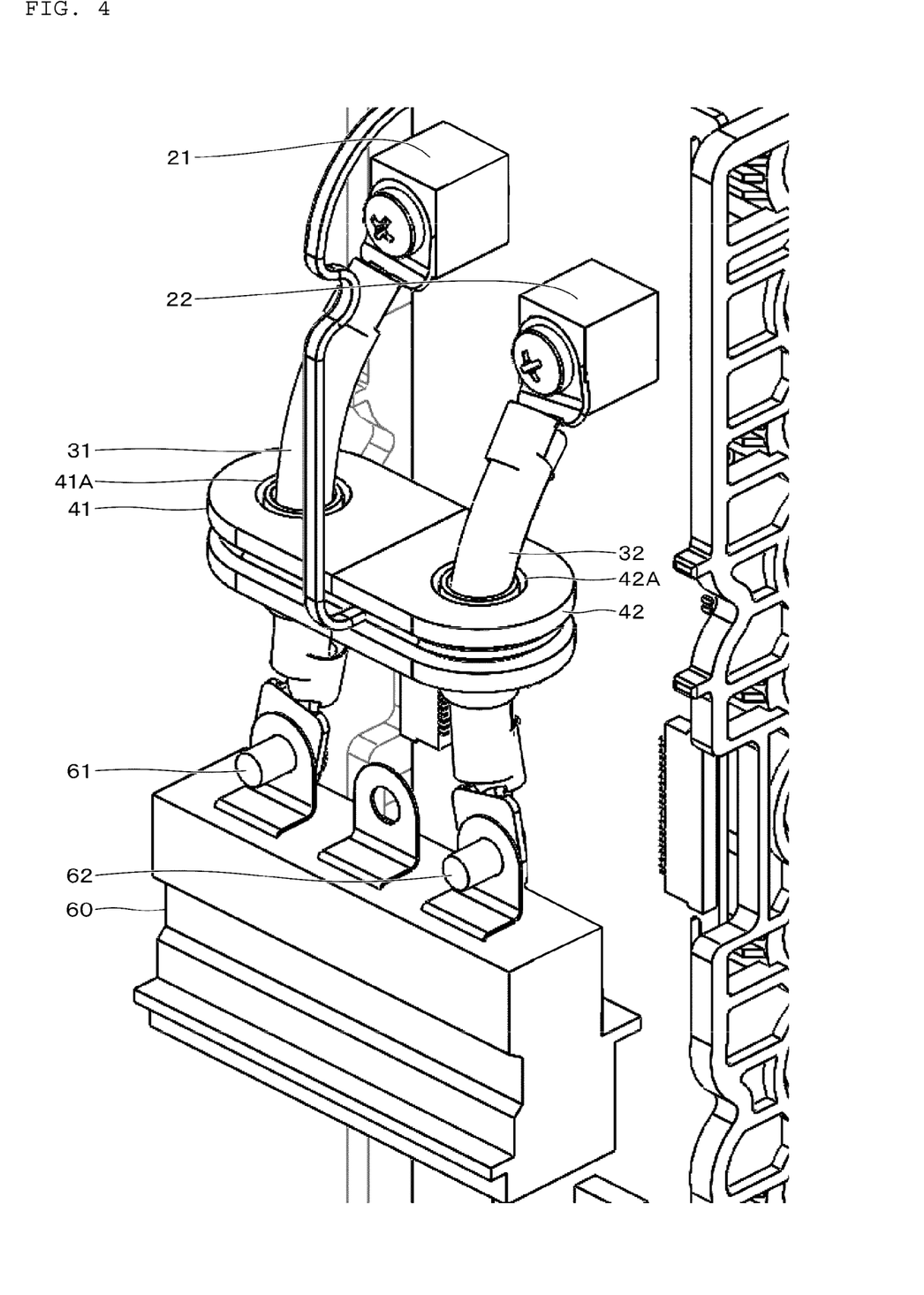
FIG. 4 is an enlarged view of a part of an internal configuration of the battery pack according to the embodiment.
Figure 5:
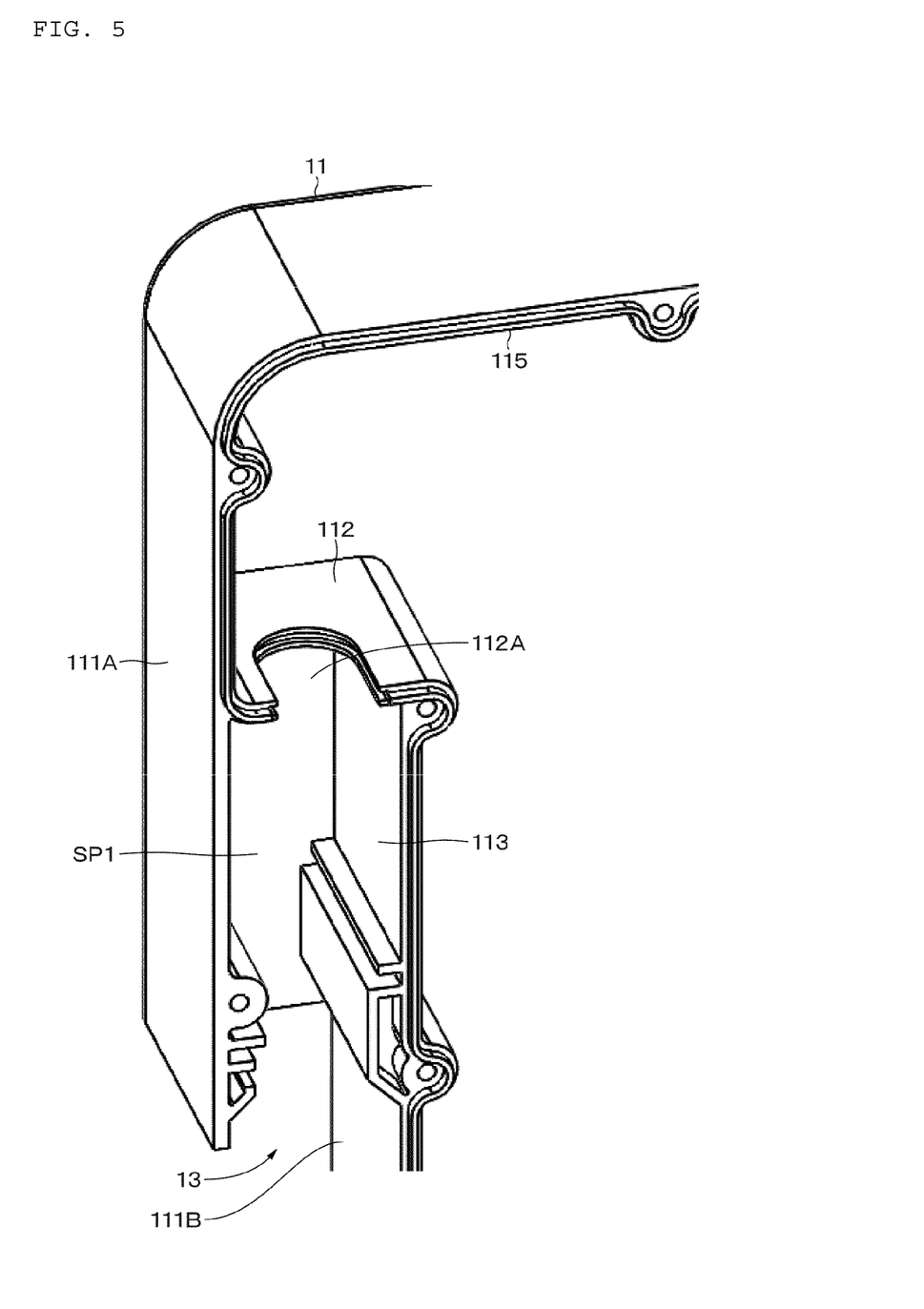
FIG. 5 is an enlarged view of a part, which is referred to in the description of the part of the configuration of the battery pack according to the embodiment.
Figure 6:
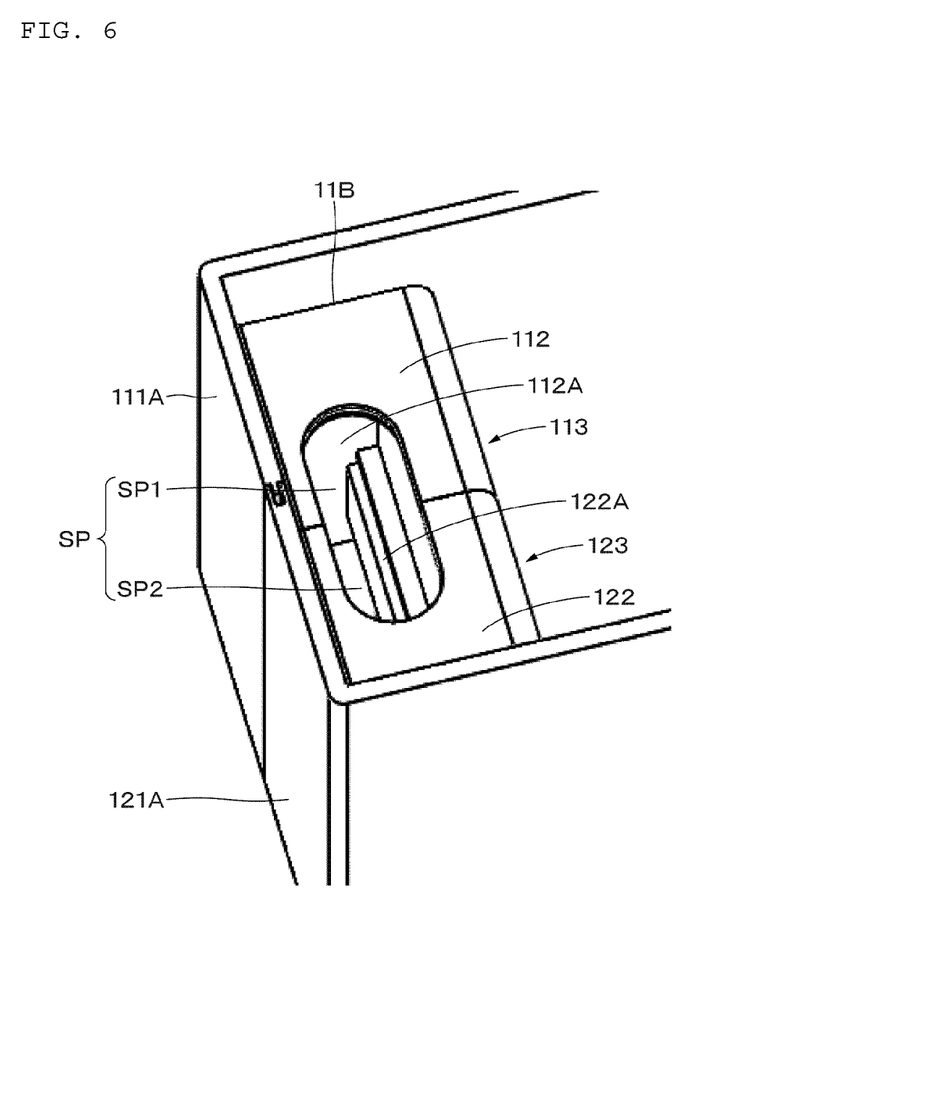
FIG. 6 is an enlarged view of a part, which is referred to in the description of the part of the configuration of the battery pack according to the embodiment.
Figure 7:
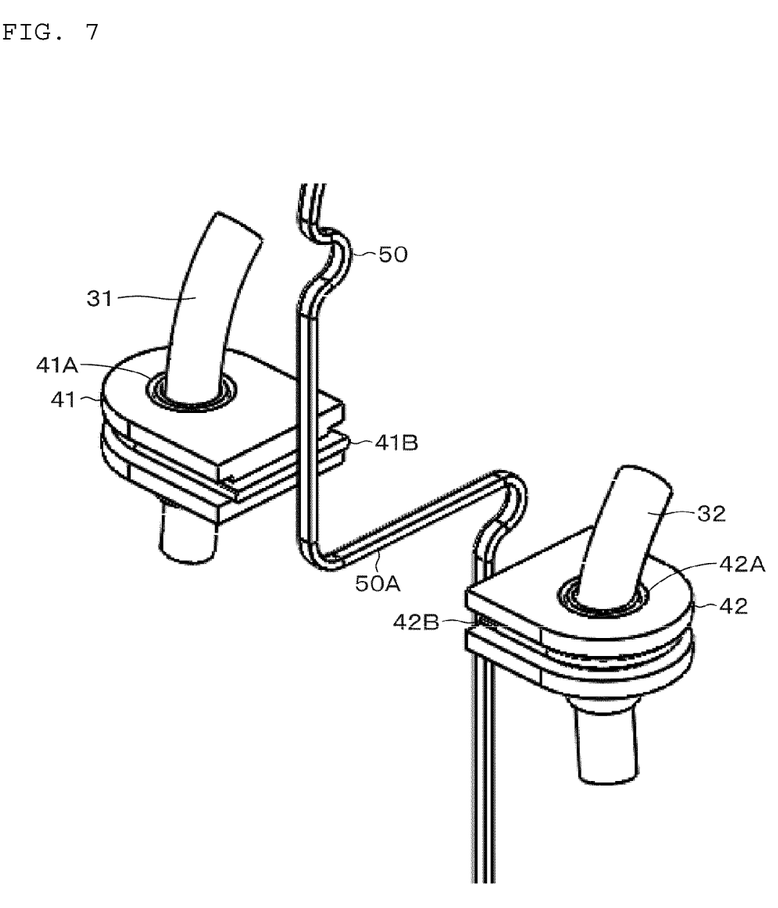
FIG. 7 is an enlarged view of a part, which is referred to in the description of the part of the configuration of the battery pack according to the embodiment.

A configuration example of a battery pack (battery pack 1) according to the present embodiment will be described with reference to FIGS. 1 to 7. FIG. 1 is an external view of the battery pack 1. FIG. 2 is an exploded perspective view of the battery pack 1. FIGS. 3 and 4 are enlarged views of parts of the internal configuration of the battery pack 1. FIGS. 5 to 7 are enlarged views of parts, which are referred to in describing the parts of the configuration of the battery pack 1. It is to be noted that in the following description, unless otherwise specified, directions such as upward, downward, leftward, and rightward directions are defined with reference to the direction shown in FIG. 1.

First, the configuration of the battery pack 1 will be schematically described. As shown in FIG. 1, the battery pack 1 has an exterior case 10. The exterior case 10 is formed from, for example, a resin. The exterior case 10 has a configuration where a case 11 that is an example of a first case and a case 12 that is an example of a second case are engaged and integrated with each other. The case 11 and the case 12 are integrated by an appropriate method with the use of a fastening member such as a screw.

The exterior case 10 has a predetermined side-surface part 10A with a step 13 formed. The step 13 has an open end, and a connector (connector 60 to be described later) is provided at a position through the open end in the exterior case 10. Connecting a terminal or a cable to the connector allows the power of the battery pack 1 to be extracted to the outside. With the step 13 as a border, the side-surface part 11A of the case 11 is partitioned into a side-surface part 111A and a side-surface part 111B, and a side-surface part 12A of the case 12 is partitioned into a side-surface part 121A and a side-surface part 121B.

As shown in FIG. 2, a battery unit 20 is housed in the exterior case 10. The battery unit 20 has, for example, a plurality of lithium ion secondary battery cells, with each cell housed in a cell holder as a configuration. The number and connection mode of the lithium ion secondary battery cells can be appropriately changed. In addition, a battery other than the lithium ion secondary battery may be used.

As shown in FIGS. 3 and 4, a positive electrode side lead wire 31, which is an example of a first lead wire, is connected to a positive electrode terminal 21 of the battery unit 20. The positive electrode side lead wire 31 is penetrated through a positive electrode side lead wire grommet 41, which is an example of a first grommet, and further, a tip of the positive electrode side lead wire 31 is connected to a positive electrode terminal 61 of the connector 60. In addition, a negative electrode side lead wire 32, which is an example of a second lead wire, is connected to a negative electrode terminal 22 of the battery unit 20. The negative electrode side lead wire 32 is penetrated through a negative electrode side lead wire grommet 42, which is an example of a second grommet, and further, a tip of the negative electrode side lead wire 32 is connected to a negative electrode terminal 62 of the connector 60.

The positive electrode side lead wire grommet 41 has, for example, a U shape. The positive electrode side lead wire grommet 41 has a hole 41A, and the positive electrode side lead wire 31 is penetrated through the hole 41A. For ensuring waterproofness, the positive electrode side lead wire 31 is press-fitted into the hole 41A so as not to produce a gap between the positive electrode side lead wire 31 and the positive electrode side lead wire grommet 41. The positive electrode side lead wire grommet 41 is formed from an elastic resin such as a rubber, an elastomer, or a silicone material.

The negative electrode side lead wire grommet 42 has, for example, a U shape. The negative electrode side lead wire grommet 42 has a hole 42A, and the negative electrode side lead wire 32 is penetrated through the hole 42A. For ensuring waterproofness, the negative electrode side lead wire 32 is press-fitted into the hole 42A so as not to produce a gap between the negative electrode side lead wire 32 and the negative electrode side lead wire grommet 42. The negative electrode side lead wire grommet 42 is formed from an elastic resin such as a rubber, an elastomer, or a silicone material.

A continuous O-ring 50 bent at appropriate sites is interposed between the case 11 and the case 12 and between the positive electrode side lead wire grommet 41 and the negative electrode side lead wire grommet 42. More specifically, the O-ring 50 is interposed at a position along ridges (a ridge 41B and a ridge 115) to be described later. In addition, the O-ring 50 is formed from an elastic resin.

The connector 60 is a connector for supplying the power of the battery unit 20 to the outside, with the connector into contact with, connected to, or the like an external terminal.

The configuration of the battery pack 1 will be described in detail. As shown in FIG. 5, a wall part 112 is provided in a direction from the vicinity of the center of the side-surface part 111A of the case 11 toward the inside of the exterior case 10 and in a direction substantially orthogonal to the extending direction of the side-surface part 111A. Further, the wall part 112 is bent downward to form a wall part 113. The wall part 113 below the step 13 is exposed to the outside as the side-surface part 111B described above.

The side-surface part 111A and a part of the wall part 113 face each other to form a facing gap SP1. The facing gap SP1 communicates with the outside of the exterior case 10 via the step 13.

The wall part 112 constituting a part of the case 11 is formed with a U-shaped notch 112A, which is an example of a first notch. The positive electrode side lead wire grommet 41 is inserted into the notch 112A. For example, when a groove formed in the positive electrode side lead wire grommet 41 is inserted into a protrusion provided at the peripheral surface of the notch 112A, the positive electrode side lead wire grommet 41 is guided into the notch 112A, and then supported by the protrusion.

The case 12 has a shape that is substantially symmetrical to the case 11. Specifically, as shown in FIG. 6, a wall part 122 is provided from side-surface part 121A toward the inside of case 12. The wall part 122 is bent downward to form a wall part 123.

The side-surface part 121A and a part of the wall part 123 face each other to form a facing gap SP2. The facing gap SP2 communicates with the outside of the exterior case 10 via the step 13.

The wall part 122 constituting a part of the case 12 is formed with a U-shaped notch 122A, which is an example of a second notch. The notch 122A is formed at a position that substantially faces the notch 112A. The negative electrode side lead wire grommet 42 is inserted into the notch 122A. For example, when a groove formed in the negative electrode side lead wire grommet 42 is inserted into a protrusion provided at the peripheral surface of the notch 122A, the negative electrode side lead wire grommet 42 is guided into the notch 122A, and then supported by the protrusion.

Further, as shown in FIG. 3, each structure is disposed such that the boundary between the case 11 and the case 12 substantially coincides with the boundary between the positive electrode side lead wire grommet 41 and the negative electrode side lead wire grommet 42.

The case 11 and the case 12 are integrated to form a space (hereinafter, appropriately referred to as a space SP) including the facing gap SP1 and the facing gap SP2. As shown in FIG. 6, without the positive electrode side lead wire grommet 41 or negative electrode side lead wire grommet 42 inserted, the notch 112A and the notch 122A are brought into contact with each other to form an elliptical hole that communicates with the space SP.

As shown in FIG. 3, the connector 60 is provided in the space SP. Further, the positive electrode side lead wire 31 penetrated through the positive electrode side lead wire grommet 41 is connected to the positive electrode terminal 61 of the connector 60. In addition, the negative electrode side lead wire 32 penetrated through the negative electrode side lead wire grommet 42 is connected to the negative electrode terminal 62 of the connector 60.

Next, a structure of the battery pack 1 for preventing entry of foreign matters, specifically, a waterproof structure thereof for preventing entry of moisture into the space in which the battery unit 20 is housed will be described. As shown in FIGS. 2, 3, and 5, the ridge 115, which is an example of a first ridge, is formed on an inner end surface (an end surface of a rectangular peripheral edge located inside) of the case 11. The ridge 115 is a protrusion for crushing the O-ring 50 when the case 11 and the case 12 are engaged. The ridge 115 is formed integrally with the case 11, for example.

It is to be noted that according to the present embodiment, the ridge 115 is not formed on the inner end surface of the side-surface part 111A located to face the wall part 113 (see FIGS. 3 and 5), because what is required is that moisture can be prevented from entering the space in which the battery unit 20 is housed.

The inner end surface of the case 12 has a groove 125 formed at a position in contact with the inner end surface of the case 11 with the ridge 115 formed, with the O-ring 50 interposed between the inner end surfaces (see FIG. 2). The O-ring 50 is housed in the groove 125, thereby positioning the O-ring 50.

With such a configuration, when the case 11 and the case 12 are integrated, the ridge 115 crushes the O-ring 50 housed in the groove 125, thereby securing the waterproof of the battery pack 1. When a plurality of grommets are used as in the present embodiment, however, moisture may possibly enter the inside of the exterior case 10 through a gap between the grommets. Thus, according to the present embodiment, the structure is employed such that the O-ring 50 is crushed by the two grommets when the case 11 and the case 12 are integrated, thereby preventing moisture from entering through the gap between the grommets.

Specifically, as shown in FIG. 7, the ridge 41B, which is an example of a second ridge, is formed on the inner end surface of the positive electrode side lead wire grommet 41. The ridge 41B is, for example, an elastic resin integrally formed with the positive electrode side lead wire grommet 41. In addition, a groove 42B is formed on the inner end surface of the negative electrode side lead wire grommet 42 facing the inner end surface of the positive electrode side lead wire grommet 41. A part of the O-ring 50 is housed in the groove 42B. Then, when the case 11 and the case 12 are integrated with the positive electrode side lead wire grommet 41 inserted in the notch 112A and the negative electrode side lead wire grommet 42 inserted in the notch 122A, a part of the O-ring 50 housed in the groove 42B (a part denoted by reference numeral 50A) is crushed by the ridge 41B. Thus, moisture can be prevented from entering through the gap between the grommets.

It is to be noted that the O-ring 50 is preferably disposed in the same plane. Specifically, the O-ring 50 is preferably disposed in the same plane with, as a normal line, the direction in which the O-ring is crushed, in other words, the direction of engaging the case 11 and the case 12. This is because when the continuous O-ring 50 is bent so as to be disposed in a different plane, the insufficient waterproof structure near the bent part will increase the risk of causing moisture to enter the inside of the exterior case 10. From such a viewpoint, the groove 42B and the groove 125 are disposed to become a continuous groove located in the same plane.

In addition, because the O-ring 50 needs to be crushed by the ridge 41B, the hardness of the positive electrode side lead wire grommet 41 including the ridge 41B is made larger than the hardness of the O-ring 50. For example, the hardness of the positive electrode side lead wire grommet 41 used is HS (Shore hardness) of 50 to 60. For the negative electrode side lead wire grommet 42, a grommet with the same hardness is used.

Advantageous Effect

According to the present embodiment described above, for example, the following effects can be obtained.

The O-ring 50 is crushed not only by the exterior case 10 but also by the positive electrode side lead wire grommet 41 and the negative electrode side lead wire grommet 42, thus making it possible to prevent the waterproof structure from collapsing at the sites where the grommets are disposed. Accordingly, the confidentiality of the case with multiple wirings disposed inside can be secured.

The need to bend the O-ring on different planes so as to avoid the positive electrode side lead wire grommet 41 and the negative electrode side lead wire grommet 42 is eliminated, thus allowing the waterproof property to be secured.

In accordance with the technique of Patent Document 1 described above, since one grommet can be installed only in one of cases, the divided position of the case thus fails to be arbitrarily set. For example, the use of one grommet capable of penetrating multiple wirings leads to the increased size of the grommet, and thus, one of cases needs to have a large depth such that the grommet can be inserted. For this reason, the divided position of the case can be set only at such a position that provides a deep case and a shallow case, and the configuration of the case is restricted. According to the present embodiment, however, the grommet is divided into two, thus making it possible to prevent the above-described restriction. For example, it is also possible to set the divided position of the case near the center. In such a case, the impact at the time of dropping is received by the two cases that are substantially equal in size, thus making it possible to prevent one of the case from being damaged by the impact.

In addition, in accordance with the technique of Patent Document 1 described above, since the grommet can be installed only in one of cases, the layout of lead wires fails to be arbitrarily set, and the lead wires can be disposed only in an area where the grommet can be installed. In addition, because the layout of the lead wires fails to be arbitrarily set, when a thick lead wire such as a power lead wire is forcibly bent and then disposed as a lead wire, the waterproof structure of the grommet may possibly fail to follow the bent lead wire, and then collapse. According to the present embodiment, the use of the two grommets allows the increased degree of freedom for the layout of lead wires. Thus, for example, the positive electrode side lead wire 31 and the negative electrode side lead wire 32 extended from the battery unit 20 can be penetrated through the respective grommets without being bent.

MODIFICATION EXAMPLE

While the embodiment of the present invention have been concretely described above, the contents of the present invention are not to be considered limited to the embodiment described above, and it is possible to make various modifications based on technical idea of the present invention.

Figure 8:
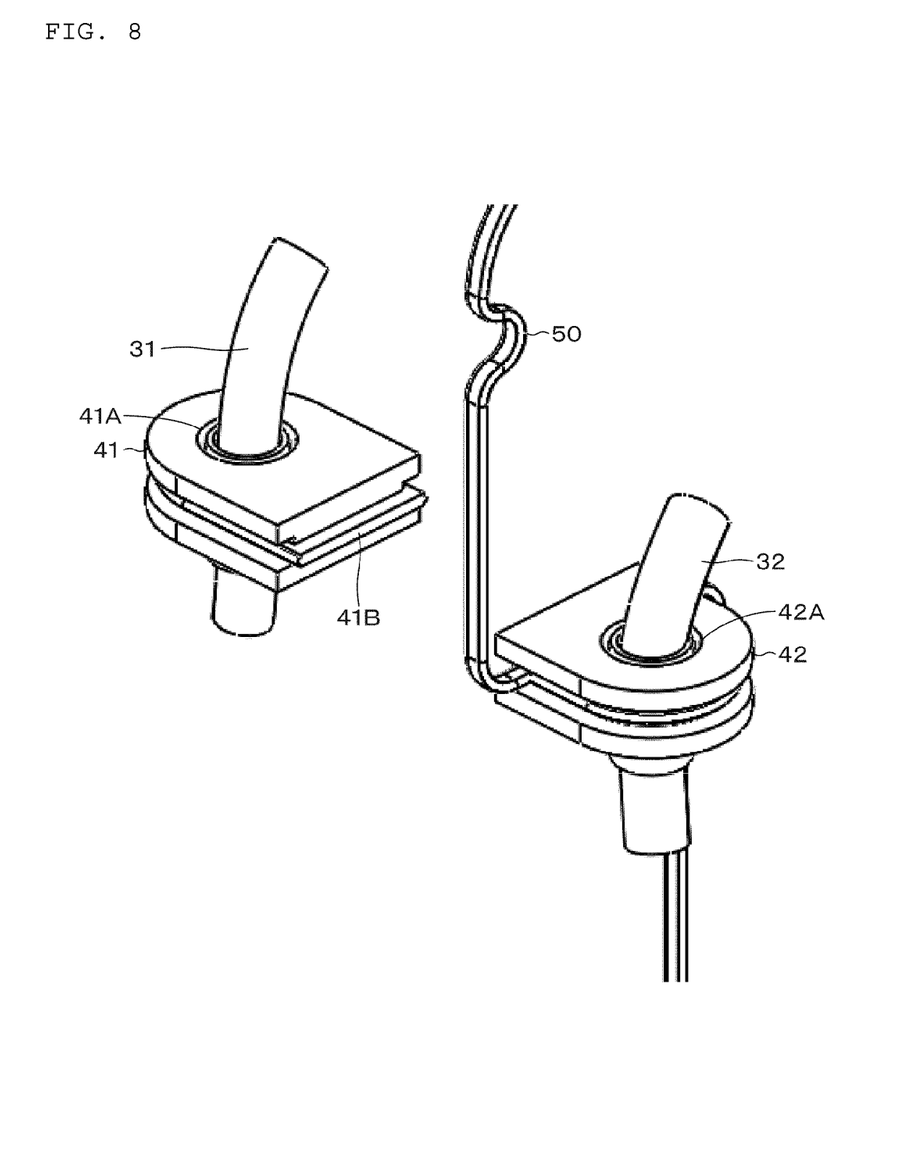
FIG. 8 is a diagram for illustrating a modification example.
Figure 9:
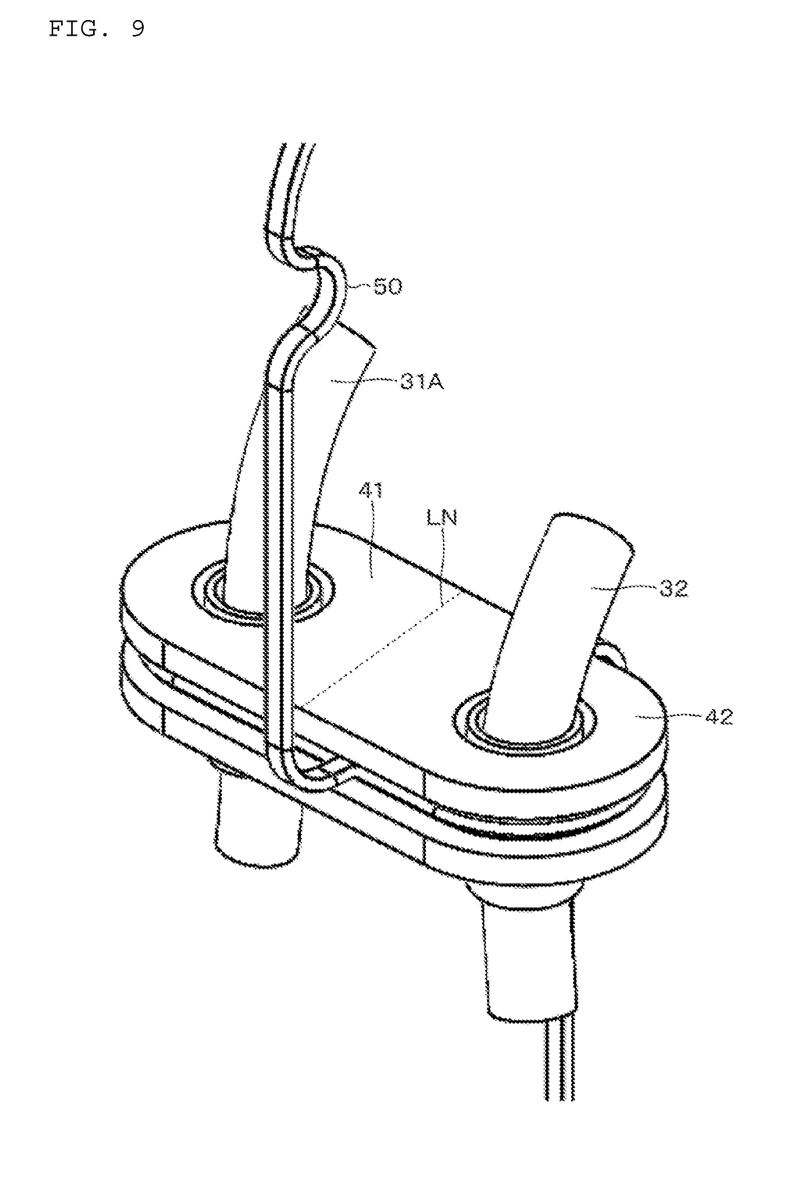
FIG. 9 is a diagram for illustrating a modification example.

As shown in FIG. 8, a part of the O-ring 50 may be made integrally with the negative electrode side lead wire grommet 42. For example, a part of the O-ring 50 may be made integrally in the same step (same resin molding) as for the negative electrode side lead wire grommet 42. In addition, a part of the O-ring 50 may be integrated by bonding or the like to the negative electrode side lead wire grommet 42. In addition, as shown in FIG. 9, a part of the O-ring 50 may be made integrally with the positive electrode side lead wire grommet 41 and the negative electrode side lead wire grommet 42. More specifically, the positive electrode side lead wire grommet 41, the negative electrode side lead wire grommet 42, and a part of the O-ring 50 may be all integrated to provide a member. In such a configuration, as shown in FIG. 9, the positive electrode side lead wire grommet 41 and the negative electrode side lead wire grommet 42 can be partitioned by an imaginary line LN near the center of the member. The configurations illustrated in FIGS. 8 and 9 makes it possible to eliminate the need for positioning by inserting a part of the O-ring 50 into the groove 42B, thereby simplifying the process.

In the embodiment described above, the shapes of the positive electrode side lead wire grommet 41, negative electrode side lead wire grommet 42, and notch into which each grommet is inserted are not limited to the U-shape, and can be appropriately changed to a rectangular shape, a polygonal shape, or the like. In addition, the positive electrode side lead wire grommet 41 may be a grommet for penetrating the negative electrode side lead wire, and the negative electrode side lead wire grommet 42 may be a grommet for penetrating the positive electrode side lead wire. In addition, the positions where the notch 112A and the notch 122A are formed in the exterior case 10 can be appropriately changed. In addition, the number of grommets may be three or more, and correspondingly, the number of notches may also be three or more. In addition, the first wiring and the second wiring may each include a plurality of wirings.

In the embodiment described above, a groove in which the O-ring 50 is housed may be formed in the case 11, and a ridge for crushing the O-ring 50 may be formed in the case 12. In addition, the positive electrode side lead wire grommet 41 may have a groove formed, and the negative electrode side lead wire grommet 42 may have a ridge formed. In this case, the positive electrode side lead wire grommet 41 and a part of the O-ring 50 may be made integrally.

Application Example

The battery packs 1 according to the present invention can be used for mounting on an electric tool, an electric vehicle, various electronic devices, or the like, or for supplying electric power thereto.

Figure 10:
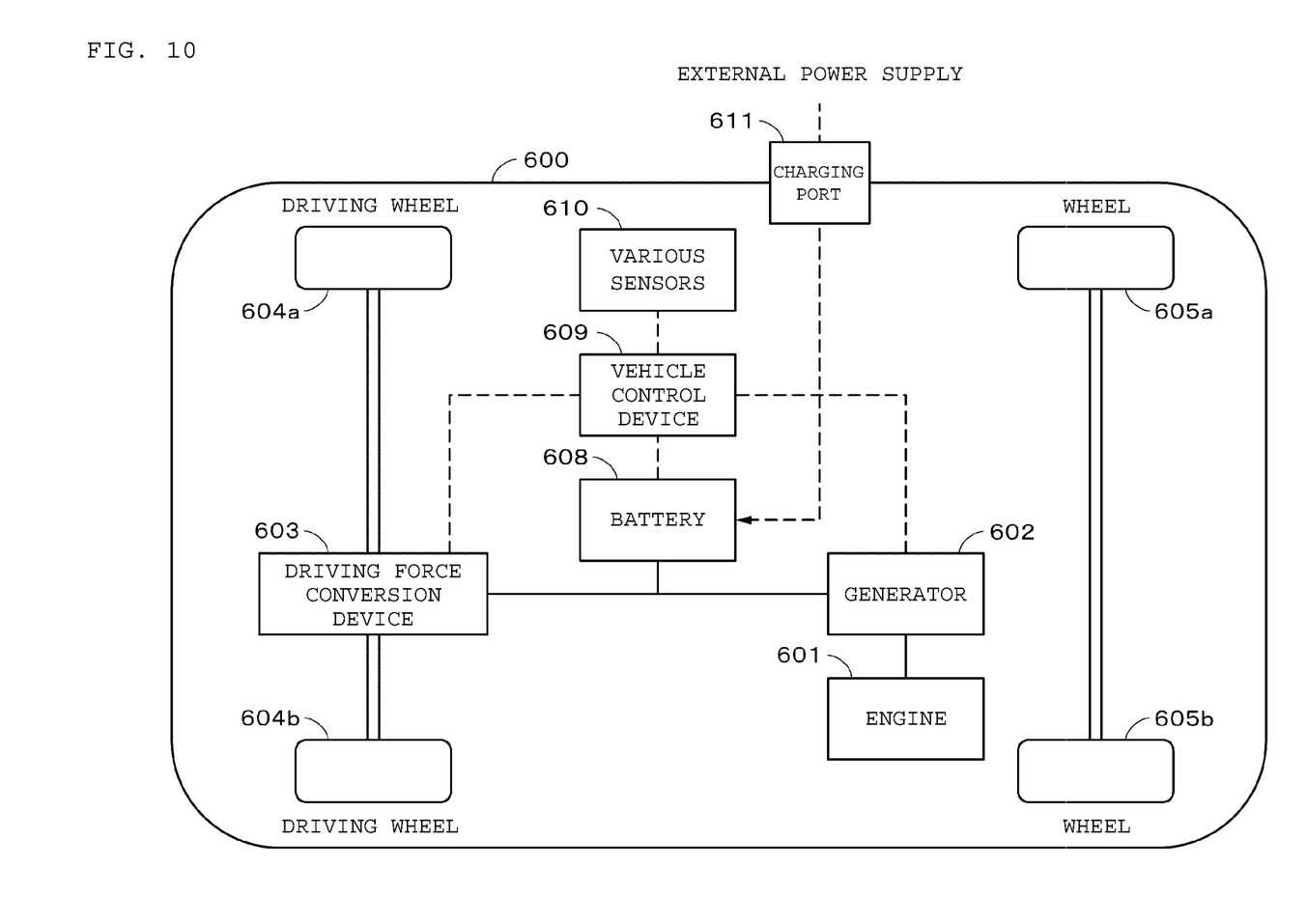
FIG. 10 is a diagram for illustrating an application example.

FIG. 10 schematically illustrates a configuration example of a hybrid vehicle (HV) that employs a series hybrid system to which the present invention is applied, as an example of applying the present invention to an electric storage system for an electric vehicle. The series hybrid system is intended for a vehicle that runs on an electric power-driving force conversion device, with the use of electric power generated by a generator powered by an engine, or the electric power stored once in the battery.

The hybrid vehicle 600 carries an engine 601, a generator 602, the electric power-driving force conversion device (direct-current motor or alternate-current motor, hereinafter referred to simply as a "motor 603"), a driving wheel 604a, a driving wheel 604b, a wheel 605a, a wheel 605b, a battery 608, a vehicle control device 609, various sensors 610, and a charging port 611. As the battery 608, the battery pack 1 according to the present invention can be applied.

The motor 603 is operated by the electric power of the battery 608, and the torque of the motor 603 is transmitted to the driving wheels 604a and 604b. The torque produced by the engine 601 makes it possible to reserve, in the battery 608, the electric power generated by the generator 602. The various sensors 610 control the engine rotation speed via the vehicle control device 609, and control the position of a throttle valve, not shown.

When the hybrid vehicle 600 is decelerated by a braking mechanism, not shown, the resistance force during the deceleration is applied as torque to the motor 603, and the regenerative electric power generated by the torque is reserved in the battery 608. In addition, the battery 608 is connected to an external power supply through the charging port 611 of the hybrid vehicle 600, thereby making charge possible. Such an HV vehicle is referred to as a plug-in hybrid vehicle (PHV or PHEV).

It is to be noted that the secondary battery according to the present invention can also be applied to a downsized primary battery, and then used as a power supply for a pneumatic sensor system (TPMS: Tire Pressure Monitoring System) built in the wheels 604 and 605.

Although the series hybrid vehicle has been described above as an example, the present invention can be also applied to a parallel system in which an engine and a motor are used in combination or a hybrid vehicle in which a series system and a parallel system are combined. Furthermore, the present invention can be also applied to electric vehicles (EVs or BEVs) that run on driving by only a driving motor without using any engine, and fuel cell vehicles (FCVs). In addition, the present invention is also applicable to an electric bicycle.

DESCRIPTION OF REFERENCE SYMBOLS

1: Battery pack
10: Exterior case
11: (First) case
12: (Second) case
31: Positive electrode side lead wire
32: Negative electrode side lead wire
41: Positive electrode side lead wire grommet
41B: (Second) ridge
42: Negative electrode side lead wire grommet
50: O-ring
112A: (First) notch
122A: (Second) notch
115: (First) ridge

The invention claimed is:

1. An electronic device comprising:
an exterior case that has a first case and a second case engaged with each other;
a first lead wire and a second lead wire each extended from an inside of the exterior case;
a first grommet through which the first lead wire is penetrated; and
a second grommet through which the second lead wire is penetrated,
wherein
the first grommet is inserted in a first notch formed in the first case,
the second grommet is inserted in a second notch formed at a position that substantially faces the first notch in the second case, and
a continuous O-ring is interposed between the first case and the second case and between the first grommet and the second grommet.

2. The electronic device according to claim 1, wherein one of the first case and the second case has a first ridge, and
the O-ring is interposed at a position along the first ridge.

3. The electronic device according to claim 2, wherein one of the first grommet and the second grommet has a second ridge, and
the O-ring is interposed at a position along the second ridge.

4. The electronic device according to claim 1, wherein the O-ring is disposed in a same plane.

5. The electronic device according to claim 1, wherein each of the first grommet, the second grommet, and the O-ring is formed from an elastic resin.

6. The electronic device according to claim 5, wherein the first grommet and the second grommet are made higher in hardness than the O-ring.

* * * * *